United States Patent [19]

Nishimura et al.

[11] 4,044,385
[45] Aug. 23, 1977

[54] PRINTING PLATE PRODUCTION APPARATUS

[75] Inventors: Masakatsu Nishimura, Settsu; Shin Saito; Kunsei Tanabe, both of Hirakata; Yasusi Umeda, Osaka; Seiji Arimatsu, Kyoto; Yasuyuki Takimoto, Takatsuki, all of Japan

[73] Assignee: Nippon Paint, Osaka, Japan

[21] Appl. No.: 667,144

[22] Filed: Mar. 15, 1976

[30] Foreign Application Priority Data

Dec. 22, 1975 Japan .................................. 50-153772

[51] Int. Cl.² ............................................. H04N 1/30
[52] U.S. Cl. ..................................... 358/300; 346/153
[58] Field of Search ........................... 178/6, 6.6 B; 346/74 ES, 76 L, 153; 358/296, 297, 300

[56] References Cited

U.S. PATENT DOCUMENTS

| 3,742,853 | 7/1973 | Landsman | 346/76 L |
| 3,778,841 | 12/1973 | Gundlach et al. | 346/74 ES |

*Primary Examiner*—Richard Murray
*Attorney, Agent, or Firm*—Cook, Wetzel & Egan, Ltd.

[57] ABSTRACT

Printing plate production apparatus wherein a latent image is formed at the surface of photoconductive insulating sheet, either by an optical system for effecting sheet exposure or by a laser emission scanning system which constitutes the terminal of a facsimile transmission system, this latent image is developed by toner particles, for example, which are applied on, but not fixed on the photoconductive sheet, the developed image is temporarily transferred onto a printing plate with which the photoconductive sheet is brought into pressure contact, and the printing plate carrying the developed image is exposed to light which may effect chemical changes in the printing plate to harden portion thereof unprotected by toner particles after which the printing plate receives treatment to remove toner particles and unhardened portions thereof. In the means of the invention a sheet carrying a developed image initially transmitted by a single facsimile transmission system may be employed as a master copy which is mounted in the exposure system and serves in production of a plurality of identical printing plates.

10 Claims, 5 Drawing Figures

PRINTING PLATE PRODUCTION APPARATUS

The present invention relates to printing plate production apparatus. More particularly the invention relates to printing plate production apparatus employing an electrophotographic process and especially suited to production of heavy-duty printing plates carrying information transmitted by a laser information transmitter system, only one transmission of a given set of image data being required for production of a plurality of corresponding printing plates.

A commonly employed method for production of printing plates in the newspaper industry for example is a photographic plate production method in which a photographic film carrying a required image content is placed in flat contact with a suitably sized plate of sensitized printing plate material, for example a sensitized resin, this plate is exposed to light directed through the film and then washed in an etchant which selectively removes portions of the plate according to the amount of light which has been allowed reach the plate by the film, whereby the required content is transferred to and carried by the plate. This method has the advantages that printing plates having excellent resolution are obtained, and that, if the plate exposure light is varied when necessary, almost any material can be employed for production of printing plates, that is the method can be employed for production both of light-service and heavy-service printing plates.

However, this method has the disadvantages that very skilled staff are required, and that even for skilled staff it is difficult to produce a photographic film which is large enough to be employable for newspaper page format, for example, but still has required resolution. A further disadvantage is that it is essential to maintain a film in perfectly flat contact with a printing plate, and to achieve this, extra, costly apparatus is necessary. In addition to this, the process is time-consuming and hence unsuited to rapid production of a printing plate or plates, as may be required in various data transmission or communication systems.

To shorten the time required to transmit image information from remote terminals to a central printing works and rapidly obtain copies of such information, it has been known recently to employ a laser transmission system wherein optical signals carrying the content of a document of which copies are required are converted to corresponding electrical signals at a remote terminal and transmitted to a central location which in response emits corresponding optical signals which are successively directed onto successive portions of a photoconductive material whereby there is immediately produced on the photoconductive material a latent image of the original document at the remote terminal and, after suitable processing, the photoconductive material may be employed as a film for production of a printing plate in the manner described above. In this process there is, however, the disadvantage that if it is required to obtain more than one printing plate carrying the content of a particular document a further facsimile transmission must be made for each printing plate required, and this is expensive. Also, while this process offers considerable saving of time in transmission of facsimile copies of documents or similar material from a remote terminal to a printing works, for example, once actual transmission and reception of image-information-carrying signals has been completed it is necessary to effect the time-consuming processes such as development and fixing of the latent image carried by the photoconductive material in order to produce a film employable for production of a printing plate. To increase speed of printing plate production process when a plurality of plates are required to be produced to carry contents corresponding to successive facsimile transmissions, it has been proposed to install a plurality of plate production sections, each including a device for holding film against printing plate material and other necessary apparatus. But in this case, increased staff, apparatus, and space is required, and also in practical situations it is difficult to ensure even quality of printing plates carrying contents corresponding to successive facsimile transmissions.

To overcome this latter problem there has been developed and made commercially available means by which a laser beam emitter unit receives signals in a facsimile transmission system and emits laser beams of corresponding power which directly etch a plate of printing plate material. Although in principle this process resolves the abovementioned problems associated with other facsimile transmission systems, in practice the size and cost of the apparatus are, at least currently, considered prohibitive in most industries and the process is very rarely used in practice.

In another comparatively recently developed process which permits rapid production of printing plates but requires only simple apparatus a first copy of content of an original document defined by toner particles as employed in conventional photocopying processes is produced on photoconductive material. This first copy is not fixed, and the photoconductive material is brought into pressure contact with printing plate material, whereby the toner particles defining the content of the original document are transferred onto the printing plate material, the transferred toner particles being subsequently fused by suitable treatment such as application of heat, and are thereby fixed on the printing plate material and may serve directly for transfer of the document content onto printing paper. Since, however, the portions of printing plates thus produced which actually make impressions on printing paper are simply fused toner particles, which are obviously less resistant to wear than solid resin or metal, apparatus for production of printing plates by this process is only of use in the light printing industry and is not suitable for employment when a large number of impressions is required to be obtained from a single printing plate.

It is accordingly a principal object of the invention to provide an apparatus for production of printing plates which does not require use of photographic film carrying the content of an original document, permits production of printing plates in a short time, and requires only simple actions on the part of staff.

It is a further object of the invention to provide a printing plate production apparatus which is employable in association with a facsimile transmission to issue newspaper in automatic process and in one and the same apparatus, permits continuous production of printing plates carrying contents corresponding to successive facsimile transmissions and which for each single facsimile transmission may produce a plurality of printing plates without producing any dust thereof.

It is another object of the invention to provide a printing plate production apparatus which is inexpensive and compact but permits production of heavy duty printing plates by the persons who are not highly trained or skilled.

In accomplishing these and other objects there is provided according to the present invention a printing plate production apparatus wherein photoconductive material in sheet form for example is carried by sheet conveyor means past a charging station and subsequently moved past a laser emission unit which forms part of the reception terminal of a facsimile transmission system and which directs onto the sheet of photoconductive material scanning beams of light which vary in intensity according to transmitted facsimile signals corresponding to the content of an original document and received by the laser emission unit, whereby a latent image of the content of the original document is formed on the sheet of photoconductive material, this image being developed in the same manner as in conventional electrophotocopying processes by toner particles which are dusted onto the photoconductive material. If only one printing plate is required, the sheet of photoconductive material is brought into pressure contact with printing plate material, which is suitably a hard resin, but which may also be metal or other wear-resistant material, whereby the toner particles defining the content of the original document are transferred onto the printing plate material. The printing plate material is then exposed to light to harden the portions of the plate material which are uncovered by toner particles, after which the toner particles and unhardened plate portions previously covered thereby are removed by washing in a suitable solvent, air blast or other suitable procedure, there thus being produced a printing plate consisting entirely of hard material and carrying the content of the original document. Needless to say, depending on the plate material employed, the light for exposure thereof subsequent to transfer of toner particles may be such as to harden plate material portions covered by the toner particles, the other portions of the plate material being subsequently removed.

If it is required to obtain a plurality of printing plates carrying the content transmitted in one facsimile transmission, after initial scanning thereof by the laser emission unit and development of an image thereon, the sheet of photoconductive material is employed as a master copy and is positioned on a stand in an optical system able to direct the image carried by this master copy onto the path travelled by the sheet conveyor means. After this, a requisite number of photoconductive sheets carried successively by the sheet conveyor means past the location of this optical system are exposed to image-wise light carrying the content of the master copy and are employed to produce printing plates in the manner described above, the laser emission unit being inoperative during this time. The printing plate production apparatus may of course be used for production of a printing plate, or plates, carrying the content of an original document which is placed directly on the stand in the abovementioned optical system.

The apparatus of the invention thus permits rapid production of one or a plurality of printing plates of hard material carrying contents transmitted in a facsimile transmission system. On the other hand, the apparatus of the invention is very simple since the principal actions required to be executed by staff are merely to place and remove sheets of photoconductive material on and from the sheet conveyor means, and, when a plurality of identical printing plates is required, to mount a master copy or an original document on the optical system stand.

The photoconductive sheets employed in the invention are, for example, constituted of sheets of paper having conductivity and electrophotosensitive layers coated on said sheets with thickness of 20 - 100 $\mu$. Also, the printing plates are preferably constituted of either photosensitive plastic plates each having a photosensitive plastic layer to be hardened by light, which is coated on a metal base such as aluminum with thickness of 300 - 1000 $\mu$, or offset PS printing plates each including a metal bases of lyophilic property coated with plastic material of degradation by light or of curing by light with thickness of several microns.

A better understanding of the present invention may be had from the following full description of one preferred embodiment thereof when read in reference to the attached drawings, in which like numbers refer to like parts, and FIG. 1 is a schematic side view, in section, showing main parts of a printing plate production apparatus according to one embodiment of the invention;

Figure 1:
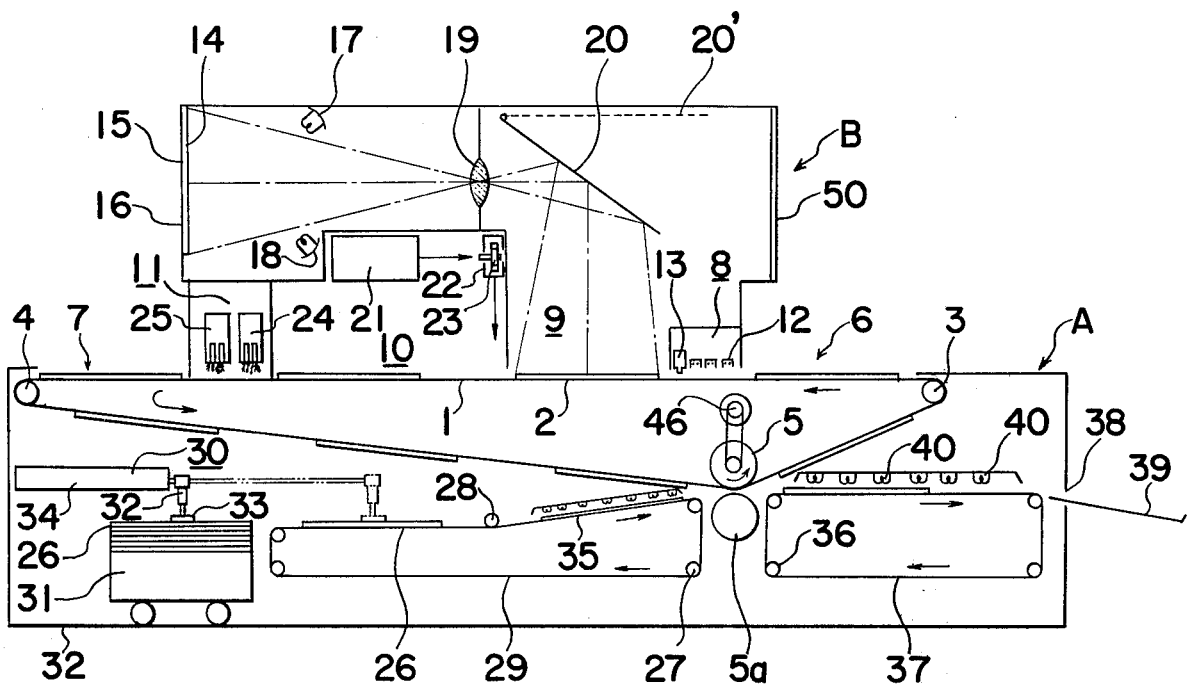

Referring to FIG. 1 there is shown in printing plate production apparatus comprising a lower housing portion A, which accommodates plate production material and means for transport and other requisite treatment thereof described below, and an upper housing portion B, which is provided above and in immediate continuation to the lower housing portion A, and accommodates an optical system 9 and laser emission system 10, both for initial production of a copy employed for printing plate production. In left to right dimension as seen in the drawing upper housing portion B is shorter than the lower housing portion A and is positioned in a generally central, or slightly off-centre position with respect to the lower housing portion A, whereby opposite end portions of the lower housing portion A are uncovered by the upper housing portion B.

Considering first the lower housing portion A, slightly below the level of the top of the lower portion A there are provided rolls 3 and 4, the roll 3 being provided close to the right-hand end wall of the lower portion A as seen in the drawing and the roll 4 almost immediately adjacent to the left-hand end wall thereof. The rolls 3 and 4 are both of the same size and have rotatory axes on a level with one another.

The lower housing portion A defines short right and left top walls A1 and A2 which extend horizontally from the right and left side walls of the lower portion A and pass above and to slightly beyond the locations of the right and left rolls 3 and 4 respectively. The lower housing portion defines no other top wall portions, and neither top wall A1 or A2, extends as far as the end walls of the upper housing portion B covering a generally central portion of the lower housing portion A. Thus, between the lower housing portion top wall A1 and the right-hand end walls of the upper housing portion B there is formed an open and accessible portion which defines a loading station 6, whose function is described in greater detail below. Similarly between the left top wall A2 of the lower housing portion A and the left-hand end wall of the upper housing portion B there is defined another open and accessible portion, which defines a checking and unloading station 7, also described in greater detail below. The remainder of the lower housing portion A defines a complete enclosure, except for a printing plate exit 38 formed in the right-hand end wall thereof.

Below the level of the rolls 3 and 4 and somewhat nearer to the right-hand roll 3 there is provided a larger-diameter roll 5, which may be driven by a motor 46, either directly via a drive belt 46a, or via a suitable pulley or gear system, the roll 5 being rotated anticlockwise as seen in the drawing. The roll 5 is suitably made of conductive rubber and together with a metal roll 5a, which is provided vertically below the roll 5, constitutes a transfer station (5, 5a) whereat an image of an original document may be transferred onto printing plate material as described in further detail below.

An endless steel belt 1 is passed around the rolls 3, 4, and 5, and may be driven around the generally triangular path defined by these rolls. The steel belt 1 has formed in edge portions thereof holes which are engaged by radial projections, not shown, in fixed or integral attachment to the rolls 3, 4, and 5. The rolls 3 and 4 act as guide rolls and the roll 5 as a drive roll for the belt 1, which, upon actuation of the motor 46, is driven anticlockwise, the upper stretch of the belt 1 being carried from right to left as seen in the drawing in a horizontal line extending between the guide roll 3 and guide roll 4 during this rotation.

At regular intervals on the steel belt 1 there are provided sets of attachment means, which as described in greater detail below, permit sheets 2 of photoconductive material to be detachably mounted on the belt 1. In the particular embodiment of the invention shown in FIG. 1 the steel belt 1 is provided with eight such sets of attachment means, whereby the belt 1 may simultaneously carry eight sheets 2.

Each sheet 2 is required to be able to form a latent image upon exposure thereof to image-wise light, and to achieve this is suitably constituted by a layer of zinc oxide or similar photoconductive insulating material coated on a sheet of conductive material such as conductive composite paper or a laminate of composite paper and aluminum foil. Needless to say, requirements of the sheet 2 may be met by various other known sheet constructions.

To the left and right respectively of the image transfer station constituted by the rolls 5 and 25 there are provided a first printing plate conveyor belt 29 and a second printing plate conveyor belt 37, both of which may be rotated clockwise and may carry successive printing plates 26 from left to right as seen in the drawing.

The first conveyor belt 29 is passed around four rolls 27a, 27b, 27c and 27d, which act to drive the first conveyor belt 29 and are themselves driven by the above-mentioned motor 46 acting through a suitable pulley or gear system, or by independent drive means. The rolls 27a and 27b are in vertical alignment with respect to one another, roll 27a being above roll 27b, and are in a left-hand portion of the lower housing portion A. The rolls 27c and 27d are also in vertical alignment with respect to one another, roll 27d being above roll 27c and being level with the junction of the transfer station rolls 5 and 25. The lower conveyor belt rolls 27b and 27c are level with one another and the right-hand pair of rolls 27c and 27d are separated by a greater interval than the left-hand pair of rolls 27a and 27b. Between the upper rolls 27a and 27d there is provided a snub or press roll 28, which presses down on the outer surface of the first conveyor belt 29 and is so positioned with respect to the upper belt conveyor rolls 27a and 27d that the upper stretch of the first conveyor belt 29, which is the portion thereof on which printing plates 26 are carried, is effectively divided into a first upper stretch portion 29a, which is horizontal and extends from the location of the left-hand upper roll 27a to that of the press roll 28, and a second upper stretch portion 29b, which has a slight degree of upward inclination in the direction of travel of the first conveyor belt 29 and extends from the location of the press roll 28 to that of the right-hand upper roll 27d.

The press roll 28 may be a single roll extending across the width of the first conveyor belt 29, or may be constituted by a pair of rolls which are mounted on a common shaft, and contact opposite edge portions of the first conveyor belt 29 and permit passage therebetween of printing plates 26 carried on the first conveyor belt 29.

Each printing plate 26 has dimensions generally equal to, or sightly greater than, those of a photoconductive sheet 2, and is suitably, but not essentially, made of material such as photopolymer resin. The printing plates 26 are initially stacked on a loading car 31, which may be moved into the lower housing portion A via a door A3 provided in the left-hand end wall of the lower portion A and operable to the position indicated by the dotted line portion of FIG. 1, and may be secured by suitable means not shown in a position adjacent to the left-hand rolls 27a and 27b for driving the first conveyor belt 29. The plates 26 may be moved one at a time from the loading car 31 to the horizontal first upper stretch portion of the first conveyor belt 29 by a feed means 30, which includes, for example, a large, horizontally disposed hydraulic cylinder 34 and associated piston 34a. The outer end of the piston 34a carries a small, vertically disposed hydraulic cylinder having associated therewith a piston 32a, the lower end of which carries a suction pad 33.

In the unactuated state of the feed means 30, both pistons 34a and 32a are retracted, and the suction pad is positioned above a central portion of the topmost printing plate 26 on the loading car 31 and is slightly above the level of the first upper stretch portion 29a of the first conveyor belt 29, as indicated by the solid line portion of FIG. 1. When the feed means 30 is actuated, first the piston 32a of the small, vertical cylinder 32 is extended to bring the suction pad 33 into contact with the uppermost printing plate 26 on the loading car 31 and at the same time a suction force is applied via the suction pad 33, whereby the pad 33 may exert a holding force on the uppermost printing plate 26. Next, while this suction force is still applied, the vertical piston 32a is retracted, thereby bringing the lower surface of the printing plate 26 held by the suction pad 33 to a height level with or very slightly above the level of the first upper stretch portion 29a of the first conveyor belt 29, and then the horizontal cylinder 34 is actuated, whereby the piston 34a is extended, as indicated by the chain-dot line portion of the drawing, and the vertical cylinder 32, piston 32a, suction pad 33 and printing plate 26 held by the suction pad 33 are moved to above the first upper stretch portion 29a. Application of suction force via the suction pad 33 is then terminated, whereby the pad 33 releases the printing plate 26, which may therefore now be carried by the first belt 29 to the transfer station constituted by rolls 5 and 25, and the horizontal piston 34a is retracted, the printing plate feed means 30 thus being returned to its unactuated position.

Needless to say, the printing plate feed means 30 may comprise two sets of cylinders 34 and 32 and associated pistons 34a and 32a and suction pads 33 disposed symmetrically with respect to the central portion of an upmost printing plate 26 on the loading car 31, thereby ensuring improved stability of printing plates 26 during feed thereof onto the first conveyor belt 29, or the printing plate feed means 30 may be constituted by other conventionally known means able to feed printing plates 26 successively onto the first conveyor belt 29.

Above the second upper stretch portion 29b of the first conveyor belt 29 there is provided a plurality of chemical lamps 35 which illuminate successive printing plates 26 carried by the first conveyor belt 29 to the image transfer station (5, 5a). The light emitted by the lamps 35 sensitizes at least upper surface portions of plates 26 on the belt 29, this sensitization being such that toner particles which, as described in greater detail below, are applied onto and define images on successive photoconductive sheets 2 may be transferred onto, and retained in at least temporary adherence to successive printing plates 26.

The second conveyor belt 37 is drivable around a generally rectangular path by four rolls 36, and has a horizontal upper stretch on which printing plates 26 are carried. The rolls 36 may be driven by independent drive means or by means also employed for driving the steel belt 1 and/or the first conveyor belt 29. The horizontal upper stretch of the second conveyor belt 37 extends from the vicinity of the image transfer station (5, 5a) to the inner end of an outlet tray 39, which is inclined downwards, passes through the abovementioned outlet 38 formed in the right-hand end wall of the lower housing portion A, and extends to the exterior of the lower housing portion A. Printing plates 26 are supplied from the second conveyor 37 onto the outlet tray 39, and by the tray 39 to the exterior of the printing plate production apparatus. Above the upper stretch of the second conveyor belt 37 there is provided a plurality of chemical lamps 40 which effect exposure of the entire upper surface of each printing plate 26 carried on the second conveyor belt 37 to light able to harden, for example, unprotected portions of the plate 26.

Considering now to the upper housing portion B, photoconductive sheets 2 carried on the upper stretch of the steel belt 1 are carried successively past a charging station 8, exposure station 9a, laser scanning station 10a, and image development station 11 which are defined within the upper housing portion B. The charging station 8, is defined by compartment walls provided inside the upper housing portion B, is provided immediately adjacent to the right-hand end wall of the upper housing portion B and comprises one or a plurality of chargers 12, for example corona discharge sources, which impose a high negative electrical charge, for example of the order of −5000V, on each photoconductive sheet 2 carried by the steel belt 1. The charging station 8 also includes a surface potential meter 13 which checks that potential on the surface of the sheet 2 is at a requisite value. Upon leaving the charging station 8, the sheet 2 is brought to the exposure station 9a, which is part of the abovementioned exposure system 9, and is defined between a vertical, inner compartment wall of the charging station 8 and a vertical, inner compartment wall of a laser emission and scanning system 10.

The exposure system 9 comprises a fixed vertical wall 15, which is constituted by an upper portion of the left-hand end all of the upper housing portion B, and a document mount 16 which may be fixed to or detached from the inner surface of the vertical wall 15 and on which an original document of which impressions are required to be printed, or a master copy of an original document constituted by a sheet 2 may be held in flat. To permit fixing or detachment of the document mount 16 to or from the wall 15, there may be provided in the upper housing portion B a slot, not shown, which permits passage of the document mount B but does not permit entry of light into the exposure system 9, or the wall 15 may be constituted as a hinged door which is completely lightproof when closed, and which is openable to permit attachment or detachment of the document mount 16.

A document mounted on the document mount 16 attached to vertical vertica wall 15 may be illuminated by lamps 17 and 18, which may be halogen lamps, for example, and are disposed symmetrically with respect to the mount 16, but are not in line with any portion of the mount 16 in a horizontal plane. There are suitably provided in association with the lamps 17 and 18 reflectors 17a and 18a, respectively, which ensure full and even illumination of a document on the mount 16. Image-wise light reflected from a document mounted on the mount 16 and thus illuminated reaches a condenser lens 19, which is mounted in a generally central, upper portion of the upper housing portion B, above the laser and emission scanning system 10. The condenser lens directs this image-wise light onto a full-reflection mirror 20 which is positioned directly above the exposure station 9a, is inclined at an angle of 45° with respect to the documen mount 16, document directs the image-wise light downwards onto a charged photoconductive sheet 2 carried on the steel belt 1 and positioned at the exposure station 9a, whereby an electrostactic latent image of the document on the mount 16 is formed in the sheet 2. upper housing the mirror 20 may be raised, by externally actuable means not shown, to a generally which position 20', indicated by the dashed line portion of the drawing, and there is provided in the right-hand end wall of the upperhousing portion B a viewing window 50, which is normally covered by a lightproof cover, but wich may be uncovered to permit checking of the setting and focus of a document on the document rest 16.

Immediately after passing the exposure station 9a, the sheet 2 is brought by the steel belt 1 to the location of the laser emission and scanning system 10, which is defined by an inner compartment 10' which prevents laser beams from passing to the exterior of the laser emission and scanning system 10 and external light from entering thereinto. In the means of the invention, a latent image of an original document is formed on a photoconductive sheet either by instantaneous exposure thereof to image-wise light directed thereonto by the exposure system 9 or by image information-carrying beams which are caused to scan successive portions of the sheet 2 in the laser emission and scanning system 10, and for any given sheet 2 only one system, 9 or 10, is actuated. In more detail, construction and action of the laser emission and scanning system 10 is as follows.

In an upper portion of the compartment 10' which houses system 10 there is provided a laser emission unit 21 which may receive electrical signals transmitted from a remote terminal and having an amplitude corresponding to darkness or lightness of portions of an original document which are successively scanned at the remote terminal. In response to such electrical input the laser emission unit 21 emits beams of light which vary in intensity in correspondence to the amplitude of the input signals. During actuation of the laser emission unit 21, the steel belt 1 is rotated slowly and successive portions of a sheet 2 carried on the belt 1 are moved past the scanning station 10a, which is located at that portion of the compartment 10' which is first entered by the sheet 2. Beams emitted by the laser emission unit 21 are directed onto a reflecting mirror 22 which inclined at 45° to the path of beams emitted by the laser emission unit 21, causes 90° deflection these beams, and is positioned close to an inner wall of the compartment 10' and vertically above the scanning station 10a. Beams reflected by the mirror 22 are directed onto a rotating mirror 23, which directs the beams downwards onto successive portions of a sheet 2 passing the scanning station 10a. The rotating mirror 23 suitably has a plurality of reflective surfaces, for example eight, so disposed that the cross-sectional shape of the mirror 23 is a regular polyhedron. During emission of beams by the laser emission unit 21, the rotating mirror 23 is rotated at a rotatory speed which is selected in reference to the number of reflecting surfaces of the mirror 23 and the time taken by the laser emission unit 21 to emit beams corresponding to one scanning line of the original document scanned at the remote terminal, and is such that each reflecting of the mirror 23 reflects one complete scanning line onto the sheet 2, whereby latent image portions corresponding to successive transverse line portions of the original document are produced on successive transverse line portions of the sheet 2.

After a latent image corresponding to an original document has been formed in a photoconductive sheet 2, either by action of the exposure system 9 or by action of the laser emission and scanning system 10, the sheet 2 is carried to the location of and moved through the developing station 11, which is contained in a small internal compartment immediately adjacent to the left-hand end wall of the upper housing portion B, i.e., in terms of the path travelled by sheets 2 on the upper stretch of the steel belt 1, immediately preceding the abovementioned checking and unloading station 7. The developing station 11 comprises a developer 24 and a cleaner 25, the developer 24 is the mixture of toner and carrier, and as a result, the mixture clinges to the magnet, forming brush-like filament. Upon brushing over a latent image toner particles transfer from the brush to the image. The cleaner 25 is only carrier which clinges to the magnet to form a brush-like filament. This cleaner removes excess toner on the developed photoconductive sheet. In this process, the toner image is made on the sheet 2 in a pattern corresponding to the latent image carried by the sheet 2, i.e., in a pattern corresponding to the content of the original document.

After passing the developing station 11, the sheet 2, now carrying a developed, viewable image, is brought by the steel belt 1 to the checking and unloading station 7, and when the entirety of the sheet 2 is in the sheet 2 is external to the upper housing portion B, whereby the sheet 2 is accessible and the entirety of the developed image carried thereby is viewable the steel belt 1 is stopped. While the steel belt 1 is stopped, the developed image on the sheet 2 is checked. Drive of the steel belt 1 recommences automatically after a certain set time, unless an external push-button PB1, or similaar means, not shown, is actuated. If push-button PB1 is actuated, the steel belt 1 is stopped indefinitely to permit correction of the image carried by the sheet 2, if necessary, or unloading of the sheet 2 for the purpose described below. After actuation of the push-button PB1, the steel belt 1 may be restarted by actuation of a push-button PB2, or similar means not show. If the sheet 2 was originally exposed by scanning beams directed thereonto at the exposure station 10a, i.e., to light beams carrying the image of an original document D located at a remote station, and if also it is required to produce only one printing plate 26 carrying the content of this original document, the push-button PB1 similar actuation means is not actuated and after a set time the steel belt 1 carries the sheet 2 around the roll 4 and towards the transfer station (5, 5a).

If the sheet 2 was exposed at the scanning station 10a, and it is required to produce more than one printing plate 26 carrying the content of the document D, the push-button PB1 is actuated and the sheet 2 is removed from the steel belt 1 and mounted on the document mount 16 attached to the left-hand vertical wall 15 of the exposure system 9, and there serves as a master copy 2MC. A new photoconductive sheet 2' is loaded on the steel belt 1 at the loading station 6, external means not shown such as a changeover switch for example is actuated, to prevent actuation of the laser emission and scanning system to and cause actuation of the exposure system 9, and a push-button PB3, or similar means not shown, is subsequently actuated to cause the steel belt 1 to be driven at requisite speeds in requisite sequences, described below, and the new sheet 2' is carried to and exposed at the exposure station 9a to image-wise light reflected from the master-copy 27c, passes the compartment 10' of the currently unactuated laser emission and scanning system 10, and is then brought to the checking and unloading station 7. During this movement of the new sheet 2', other sheets 2", 2"', etc. corresponding in number to the number of identical printing plates 26 which it is required to produce are successively loaded onto the steel belt 1 at the loading station 6.

If the sheet 2 at the checking and unloading station 7 is a sheet 2 which was exposed at the exposure station 9a to image-wise light reflected from an original document D' which is available in the same locations as the printing plate production means and is held in the document mount 16, or a sheet 2', 2", 2"', etc., such as described above, the image carried by the sheet 2 is simply checked, the push-button PB1 to stop drive of the steel belt 1 is unactuated, and the sheet 2 is left on the steel belt 1.

According to another embodiment of the invention, the steel belt 1 is stopped automatically for an indefinite period when a sheet 2 has been brought to the checking and exposure station 7, and is only restarted upon actuation of a push-button PB1' or similar means.

When the steel belt is actuated automatically or in response to actuation means such as described above and commences carrying a sheet 2 from the checking and unloading station 7, the first conveyor belt 29, second conveyor belt 30, feed means 30, and control circuits not shown of the printing plate sensitization lamps 35 and of the printing plate exposure lamps 40 are actuated. Thus, for each sheet 2 which is carried past the checking and unloading station 7 and transported to the transfer station constituted by rolls 5 and 5a, one printing plate 26 is loaded on the first conveyor belt 29 and also transported to the transfer station (5, 5a), the printing plate 26 being sensitized by the chemical lamps 35 as it approaches the transfer station (5, 5a). The rotatory speed of the steel belt 1 during transport of a sheet 2 from the checking and unloading station 7 to the transfer station (5, 5a), the speed of action of the feed means 30 and the rotatory speed of the first conveyor belt 29 are such that the sheet 2 carried by the steel belt 1 and printing plate 26 carried by the first conveyor belt 29 arrive simultaneously at the transfer station (5, 5a). As the roll 5 is rotated at this time, and the rolls 5 and 5a are urged together by a suitable spring force, the sheet 2 and plate 26 are moved simultaneously between the rolls 5 and 5a, while pressed together in surface-to-surface contact, whereby the toner particles defining an image of an original document on the sheet 2 are transferred onto the plate 26. To assist this transfer, the rolls 5 and 5a, which as noted above are made of conductive material, may be maintained at a certain electric potential relative to one another, as well as being urged together by pressure means.

After passing through the transfer station (5, 5a) the sheet 2 is carried upwards by the steel belt 1 towards the loading station 6, while the printing plate 26 now carrying a toner image is moved onto the second conveyor belt 37 and moved thereby towards the outlet tray 39. When the sheet 2 reaches the loading station 6 it is removed from the steel belt 1 and, unless there is continuous production of printing plates 26, the steel belt 1 is stopped. During transport of the printing plate 26 by the second conveyor belt 37 the entire surface of the plate 26 is exposed to light emitted by the chemical lamps 40, this light acting to harden surface portions of the plate 26 which are unprotected by toner particles. After this exposure, the printing plate 26 is supplied by the second conveyor belt 37 onto the outlet tray 39, and the plate 26 moves down the tray 39 to the exterior of the apparatus. The printing plate 26 is subsequently washed, or receives air-blast or other conventionally known processing treatment to remove toner particles and unhardened portions of the plate 26, which is thereby made ready to print impressions of the original document D.

Thus, the means of the invention permits simple production of successive, different printing plates, or a plurality of identical printing plates carrying contents of locally available documents, or document contents which are transmitted by a facsimile transmission system, only one facsimile transmission being required in order to produce any number of identical printing plates. It is to be noted that the means of the invention requires only very simple actions to be performed by staff. It is also to be noted that although photoconductive sheets must be moved slowly for a short time, during laser beam scanning thereof, at other times the photoconductive sheets and printing plate material may be moved through the apparatus rapidly, for example at 5cm/sec, and the printing plate production process may therefore be effected in short enough time to meet requirements in news printing, or other situations in which printing plate production must be rapid.

The material of printing plates 40 may of course be such that plate portions protected by resin particles remain hard and other, unprotected portions are rendered removable by air blast or other treatment. Also, needless to say, the process for removal of plate 26 portions may be effected in a compartment which is placed in direct continuation to the feed-out end of the second belt conveyor 37, and through which printing plates 26 are carried by suitable conveyor means.

Figure 2:
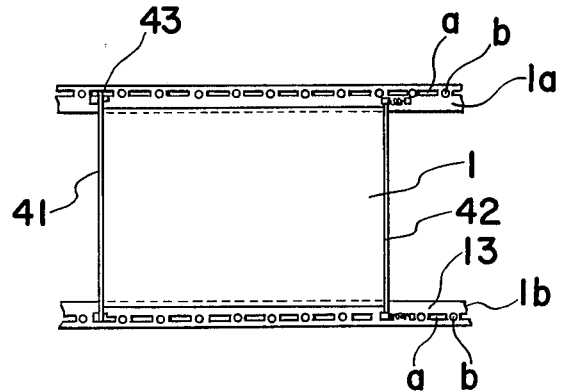
FIGS. 2 and 3 are respectively plane and side views of conveyor means and photoconductive sheet and mounting means employable in the apparatus of FIG. 1.
Figure 3:
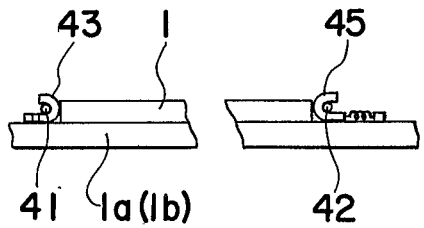

Referring now to FIGS. 2 and 3, according to one embodiment of the invention, the steel belt 1 is constituted by two parallel endless bands 1a and 1b, which are made of stainless steel for example, and in each of which there are formed alternate elliptical holes a and round holes b engageable by radial projections on the belt 1 rolls 3, 4, and 5. Each photoconductive sheet 2 loaded onto the steel belt 1 may be held in position, and in flat alignment thereon by a pair of thin rods 41 and 42, which pass through or are otherwise attached to opposite ends of the sheet 2 and extend transversely across the steel belt 1. Opposite ends of the rod 41 which is attached to the leading end portion of the sheet 2 fit into hooks 43 which are fixedly mounted on the bands 1a and 1b and are curved oppositely to the direction of rotation of the belt 1, and act to retain the rod 41. The opposite ends of the rod 42, which is attached to the rear end of the sheet 2, are engaged by hooks 45 provided on the bands 1a and 1b. Each hook 45 is curved towards the direction of rotation of the belt 1, and has a rear end fixedly attached to one end of a spring 44, whose other end is fixedly attached to the band 1a or 1b. The rods 45 being otherwise unattached, and the leading end of the sheet 2 being held in a fixed position by the rod 41 engaged by the hooks 43, the springs 44 act to pull the rod 42 rearwards with respect to the direction of belt 1 travel and so maintain tension, and hence good flatness of the sheet 2. It will be noted that this manner of holding photoconductive sheets 2 on the belt 1 permits rapid and easy loading or unloading of sheets 2 onto or from the belt 1. Pairs of hooks 43 and 45 are provided at regular intervals on the belt 1, to permit simultaneous mounting of a plurality of evenly-spaced sheets 2 on the belt 1, and when this manner of mounting sheets 2 is employed, hooks 43 and 45 are also suitably provided on the document mount 16, to facilitate mounting of a master copy 2MC thereon. The belt 1 may of course be continuous across its entire width, although this is not essential when rods 41 and 42 are employed for mounting sheets 2.

In another method of mounting sheets 2 on the belt 1, the sheets 2 are engaged directly by hooks 43 and 45 such as described above.

Action of the above described means is resumed below first in reference to the flowchart of FIG. 4 and then in reference to timing chart of FIG. 5.

Figure 4:
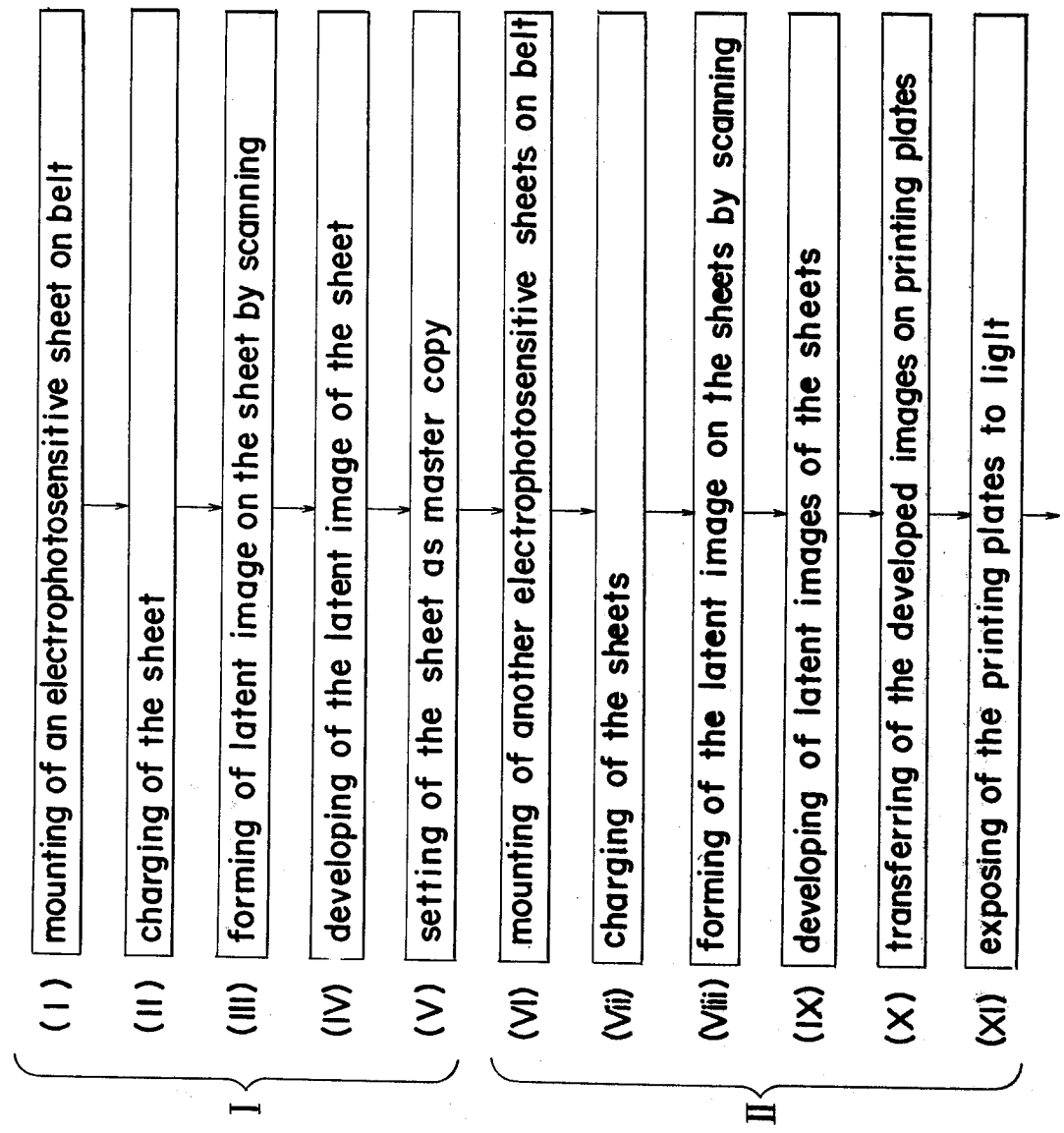
FIG. 4 is a flowchart of a plate production process in the apparatus of FIG. 1.

FIG. 4 is a flowchart of action when the image of an original document D is initially transmitted to the printing plate production means via a facsimile transmission system, it being supposed that the time of commencement of facsimile transmission is known. First, at step (i), a photoconductive sheet 2 is mounted on the belt 1 at the loading station 6. Next, the motor 46 is actuated a sufficient time before the start of facsimile transmission for the belt 1 to bring the leading end of the photoconductive sheet 2 to the scanning station 10a simultaneously with commencement of facsimile transmission. The time at which the belt 1 should be started may easily be determined since the time required to transport the sheet 2 from the loading station 6 to the scanning station 10a is known, and may be indicated in a suitable manner on an apparatus control panel, for example.

At step (ii), the sheet 2 carried by the belt 1 is charged to a high negative potential, e.g., −5000V, by the charging station 8, after which the sheet 2 passes the exposure station 9a without being exposed to light since the exposure system 9 is unactuated at this time. Then, at step (iii), the sheet 2 is moved through the scanning station 10a whereat a latent image of document D is formed in the sheet 2 by light beams emitted by the laser emission unit 21 in response to input signals received from a facsimile transmission system. During movement of the sheet 2 through the scanning station 10a, belt 1 speed is suitably of the order of 0.5 cm/sec. At all other times, the sheet 2 is transported by the belt 1 at a speed of the order of 5 cm/sec.

At step (iv), the latent image carried by the sheet 2 is developed at the developing station 11. After this, at step (v), the belt 1 brings the sheet 2 to the checking and unloading station 7 and is then stopped. Presuming more than one printing plate 26 carrying the content of the document D is required, the sheet 2 is unloaded from the belt 1 and mounted on the document mount 16, to serve as a master-copy 2MC, further transmission by the facsimile transmission system thus being unrequired. This completes a first production stage I.

Stage I is followed by a second production stage II, which includes steps (vi) through (xi). At step (vi), a new photoconductive sheet 2' is loaded on the steel belt 1 at loading station 6, suitable control means are actuated to prevent actuation of the laser emission and scanning system and cause actuation of the exposure system 9, and then the motor 46 is actuated to drive the steel belt 1.

The new sheet 2' is charged to a negative potential at step (vii), and is then exposed to image-wise light reflected from the master copy 2MC and transmitted by the exposure system 9 at step (viii), the new sheet 2' being temporarily held stationary at the exposure station 9a during this exposure.

The new sheet 2', now carrying a latent image of the document D is carried to the developing station 11, and the latent image is developed at stop (ix).

At step (x), the new sheet 2' is brought into pressure contact with a printing plate 26 at the transfer station (5, 5a), whereby the developed image of the document D is transferred onto the printing plate 26, which is subsequently exposed to light emitted by the lamps 40 at stage (xi), and then processed in the manner described above. This completes the process for production of one printing plate. For each identical printing plate required to be produced the steps (vi) through (xi) of stage II only are repeated.

If it is required to produce only one printing plate carrying the image of the document D transmitted by the laser transmission system, the original photoconductive sheet 2 is not removed from the belt 1 to be mounted on the document mount 16, but is transported directly to the transfer station (5, 5a) to transfer a developed image onto a printing plate 26, i.e., the step (v) of stage I and steps (vi) through (ix) of stage II are omitted.

In continuous production of a plurality of identical printing plates, in order to render the overall process more rapid, successive new photoconductive sheets are loaded onto the steel belt for transport thereof while preceding photoconductive sheets are still passing through the printing plate production apparatus. This is illustrated in the timing chart of FIG. 5, to which reference is now had.

Figure 5:
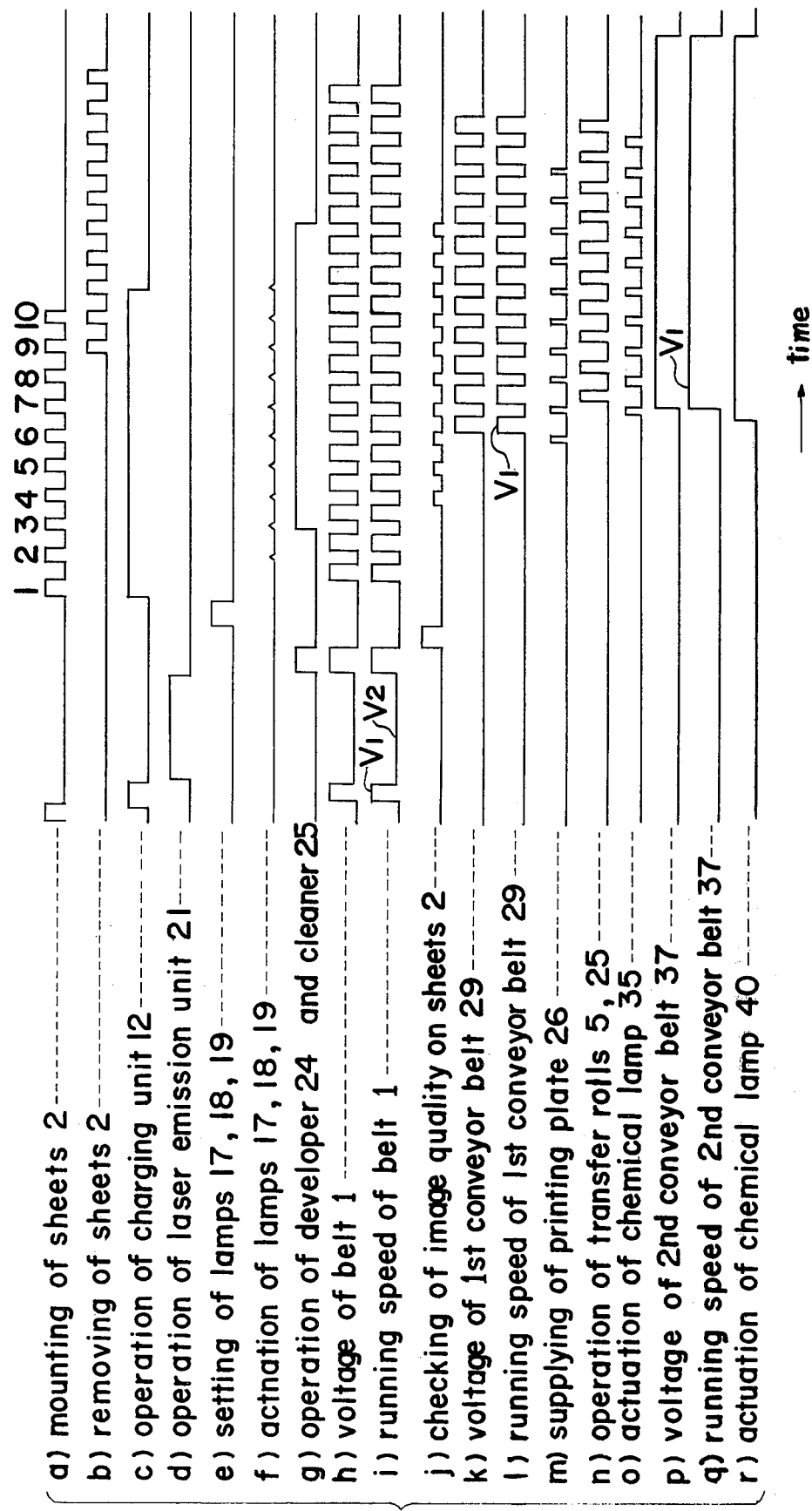
FIG. 5 is a timing chart of processes effected in the apparatus of FIG. 1 in production of printing plates.

The timing chart of FIG. 5 illustrates action when the steel belt 1 is able to simultaneously carry eight photoconductive sheets 2, when the image of an original document D is initially transmitted by a facsimile transmission system, and when it is required to produce ten printing plates carrying the content of the document D.

First a sheet 2 is mounted on the belt 1, the charger unit 12 is actuated and the belt 1 carries the sheet 2 past the charger unit 12 at a speed V1, for example 5 cm/sec., then at a speed V2, for example 0.5 cm/sec. past the scanning station 9a where a latent image is formed in the sheet 2, then at speed V1 through the developing station 11 and to the checking and unloading station 7. When the sheet 2 reaches station 7, the belt 1 is stopped.

Next, the initial sheet 2 is mounted on the document mount 16, the exposure system 11 is set ready for actuation thereof, and a new sheet 2 (1) is mounted on the belt 1, and the belt 1 is started again. The charging unit 12 remains actuated during the entirety of the process for production of the required number of printing plates, and when in motion the belt 1 moves at speed V1.

The new sheet 2 (1) is carried past the charging unit 12 and to the exposure station 9a. When the sheet 2 (1) has been brought to the exposure station 9a, the belt 1 is stopped temporarily. While the belt 1 is stopped, the lamps 18 and 19 are actuated, thereby resulting in exposure of the sheet 2 (1) to image-wise light reflected from the initial sheet 2 which is now mounted on the document mount 16. Also, during this time, the next sheet 2 (2) is loaded on the belt 1 at loading station 6. Successive sheets 2 (3) through 2 (10) are loaded onto the belt 1 at corresponding times when the belt 1 is stopped to permit exposure of preceding sheets 2 (2) through 2(9).

Sheet 2 (1) is brought to the checking and unloading station 7 at the same time as sheet 2 (3) is brought to the exposure station 9a. Shortly after exposure of sheet 2 (4) a first printing plate 26 (1) is loaded onto the first conveyor belt 29 and then the first conveyor belt 29 is actuated to carry the plate 26 (1) to the transfer station (5, 5a), the chemical lamps 35 being actuated for a short time immediately prior to arrival of the plate 26 (1) at the transfer station (5, 5a). During this time also the next printing plate 26 (2) is loaded onto the first conveyor belt 29, and the succeeding sheet 2 (2) is being transported from the checking and unloading station 7 towards the transfer station (5, 5a).

After arrival of the first sheet 2 (1) and first printing plate 26 (1) at the transfer station (5, 5a), the chemical lamps 40 and drive means of the second conveyor belt 37 are actuated, and remain actuated during the entire remainder of the plate production process, to effect exposure of plates 26 (1) through 26 (10) and transport thereof to the exterior of the apparatus.

The above process is repeated for successive sheets 2 and printing plates 26. When sheet 2 (8) reaches the exposure station 9a, the first sheet 2 (1) is simultaneously brought to the loading station 6. At this time, although the developed image previously carried by the sheet 2 (1) has been transferred onto the printing plate 26 (1), there is still a remnant electrical charge present in the sheet 2 (1), which renders the sheet 2 (1) unsuitable for production of a further image. The sheet 2 (1) is therefore removed, and a new photoconductive sheet 2 (9) is mounted on the belt 1. Subsequent sheets 2 (2) through 2 (10) also are removed when they again arrive at the loading station 6. To bring the last sheet 2 (10) to the loading station 6 again, rotation of the belt 1 is continued for a short time after transfer of the developed image from the last sheet 2 (10) onto the last printing plate 26 (10) at the transfer station (5, 5a).

To assist the transfer process, printing plates 26 suitably have slightly adhesive surfaces, although completely satisfactory transfer is effected simply by pressure of the transfer rolls 5 and 5a. For example, when the printing plates were the photopolymer letterpress plates commercially available under the name of "NAPP 30 PAN" (manufacture by NAPP Systems (U.S.A.) Inc. of U.S.A.), transfer ratio was in the range 95 % – 97 %. In the transfer process, for example, when the presensitized offset plate is used as printing plate, the electric potential is applied between the rolls.

As is clear from the above description the present invention permits production of single printing plates or continuous production of identical printing plates in a rapid, easily effected process. Also, although the printing plates are produced rapidly, the means of the invention is easily associated with a facsimile transmission system, and also permits production of plates made of strong material and able to produce a large number of impressions.

What is claimed is:

1. Printing plate production apparatus with employment of a photoconductive insulating sheet including a conductive base having a coating of a photoconductive insulating material thereon, said photoconductive insulating material being capable of varying its resistance from high to low by light, comprising:
   a photoconductive insulating sheet transport means for conveying the photoconductive insulating sheet through the apparatus, said transport means being provided with both a loading station and an unloading station for said sheets, said stations being spaced apart along the path formed by said transport means;
   a corona discharge means disposed adjacent and subsequent said loading station by which a charge is trapped on said coating where said photoconductive material is in said high condition;
   image information-carrying light emission and scanning means disposed subsequent to said corona discharge means, said light emission and scanning means having modulating means for varying the amount of light in response to a transmitted original document signal and writing means for forming a latent image by applying light to selected regions of said coating, in an amount sufficient to vary the resistance of said photoconductive insulating material from said high to low;
   developing means disposed subsequent to said light emission and scanning means and adjacent to said unloading station for applying toner particles to said photoconductive sheet which cling to said coating at said selected regions, whereat a latent image is formed;
   optical exposing means disposed between said corona discharge means and said light emission and scanning means for forming latent image to the previously prepared charged photoconductive insulating sheet by using said developed image as master copy;
   transferring means disposed subsequent to said developing means through said unloading station for conveying the said developed powder images from the surface of the said photoconductive material sheet directly to the surface of the printing plates, passing through between two rolls, and applying uniform pressure along their moving line of contact;
   printing plate transport means disposed adjacent said transferring means for transport of said printing plates through said transfer station; and
   control means connected to the said each means, corona discharge means, writing means, modulating means, exposing means, developing means, transferring means, and transport means of photoconductive sheet and printing plate.

2. Apparatus as defined in claim 1, wherein said writing means employs a beam of modulated laser as said light.

3. Apparatus as defined in claim 1, wherein said transferring means includes an optical exposing means to effect chemical change their portions of the said printing plate which are incontacted by the said powder image after transferring.

4. Apparatus as defined in claim 1, wherein said transferring means includes the addition of means for applying an electric potential between the photoconductive surface and the printing plate in passing through between two rolls.

5. Printing plate production apparatus with employment of a photoconductive insulating sheet including a conductive base having a coating of a photoconductive insulating material thereon, said photoconductive insulating material being capable of varying its resistance from high to low by light, comprising:
   at least one latent image formation station whereat a latent image corresponding to the content of an original document may be formed on the photoconductive sheet;
   a developing station whereat toner particles may be applied onto and transfer to the said latent image, thereby to produce the developed toner image on the said sheet;
   a transfer station whereat the said developed toner image carried by the said sheet may be transferred onto and caused to adhere to the printing plate;
   plate treatment station whereat those portions of the said printing plate which are uncontacted by the said toner image are rendered different from those portions of said plate which is contacted by the said toner image, whereby selective removal of portions of the said plate may be effected and the said plate may define surface portions corresponding to the contents of the said original document;
   sheet transport means for transport of said sheet through said latent image information, said developing station, and said transfer station; and
   printing plate transport means for transport of said printing plate through said transfer station and said plate surface treatment station.

6. The apparatus of claim 5, wherein the printing plates are photopolymer printing plates having a photopolymer resin layer and the plate treatment station includes a light exposure means to harden the portions of the photopolymer resin layer of the plates which are unprotected by the toner image; and further comprising a plate treatment means disposed subsequent to the plate treatment station to remove toner particles and the unhardened portions of photopolymer resin from the printing plate after the photopolymer printing plate has been exposed to light at the plate treatment station.

7. Printing plate production apparatus with employment of a photoconductive insulating sheet including a conductive base having a coating of a photoconductive insulating material thereon, said photoconductive insulating material being capable of varying its resistance from high to low by light, comprising:
   at least one latent image formation station whereat a latent image corresponding to the content of an original document may be formed in successive sheets of electrophotoconductive material;

at least one image transmission means to transmit an image corresponding to the content of the original document onto said sheets, thereby to form said latent image on said sheets;

a developing station whereat image-defining toner particles may be applied onto and caused to form image-forming patterns on said sheets carrying said latent image;

a transfer station whereat image-defining toner particles formed on successive sheets at said developing station may be transferred onto and caused to temporarily adhere to successive printing plates;

plate treatment station whereat those portions of successive said printing plates which are unprotected by said image-defining toner particles are rendered different from those portions of said plates which are protected by said image-defining toner particles, whereby selective removal of portions of said plates may be effected and said plates may define surface portions corresponding to the contents of said original document;

sheet transport means for transport of said sheets through said latent image formation station, said developing station, and said transfer station; and printing plate transport means for transport of said printing plates through said transfer station and said plate surface treatment station.

8. Printing plate production apparatus as recited in claim 7, wherein there are provided two independent latent image formation stations and two independent image transmission means in correspondence thereto, one said image transmission means being constituted by a laser emission and scanning system able to receive electrical input from a facsimile transmission system and to produce light beam output in response to said input, and the corresponding said latent image formation station being a scanning station whereat successive portions of successive said sheets may be scanned by light beam output emitted by said laser emission and scanning system, and the other said image transmission means being constituted by an exposure system and corresponding said latent image formation station being an exposure station whereat successive said sheets may be temporarily held stationary, said exposure system being able to direct image-wise light reflected from successive documents mounted in a set position in said exposure system onto successive said sheets at said exposure station, said laser emission and scanning system and said exposure system being selectively actuable.

9. Printing plate production apparatus as recited in claim 8, which further includes a sheet unloading station which is provided on the path of said sheet transport means subsequent to said developing station, and at which a sheet carrying an image initially transmitted via said laser emission and scanning system may be removed from contact with said sheet transport means, thereby permitting subsequent mounting of said removed sheet in said set position in said exposure system and production of a plurality of printing plates carrying the content of said sheet.

10. Printing plate production apparatus as recited in claim 7, which said transfer station includes addition of means for applying an electric potential between two rolls.

* * * * *

UNITED STATES PATENT OFFICE
CERTIFICATE OF CORRECTION

PATENT NO. : 4,044,385
DATED : August 23, 1977
INVENTOR(S) : Nishimura et al.

It is certified that error appears in the above-identified patent and that said Letters Patent are hereby corrected as shown below:

ABSTRACT, line 13, "changes" should read --change--.

Column 8, line 19, "vertical vertica wall 15" should read --the vertical wall 15--.

line 35, "documen" should read --document--.

line 40, "upper housing" should read --Preferably--.

line 42, "which" should read --horizontal--.

line 44, "upperhousing" should read --upper housing--.

line 46, "wich" should read --which--.

Column 9, line 68, "similaar" should read --similar--.

Column 10, line 7, "show" should read --shown--.

Signed and Sealed this

Twentieth Day of December 1977

[SEAL]

Attest:

RUTH C. MASON
Attesting Officer

LUTRELLE F. PARKER
Acting Commissioner of Patents and Trademarks